United States Patent [19]

Smith

[11] Patent Number: 5,170,076
[45] Date of Patent: Dec. 8, 1992

[54] THRESHOLD COMPARATOR IMMUNIZED AGAINST NOISE

[75] Inventor: Alan Smith, Aix en Provence, France

[73] Assignee: SGS-Thomson Microelectronics S.A., Gentilly, France

[21] Appl. No.: 624,088

[22] Filed: Dec. 4, 1990

[30] Foreign Application Priority Data

Dec. 5, 1989 [FR] France ................ 89 16044

[51] Int. Cl.$^5$ .................. H03K 5/153; H03K 5/00
[52] U.S. Cl. ................ 307/354; 307/360; 307/296.5
[58] Field of Search ......... 307/350, 354, 360, 296.5, 307/464, 496

[56] References Cited

U.S. PATENT DOCUMENTS

| | | | |
|---|---|---|---|
| 3,768,024 | 10/1973 | Letosky ................ | 307/354 |
| 4,326,136 | 4/1982 | Le Can et al. ............ | 307/464 |
| 4,356,481 | 10/1982 | Kuki . | |
| 4,521,696 | 6/1985 | Raghunathan ............ | 307/350 |
| 4,571,504 | 2/1986 | Iwamoto et al. ........... | 307/360 |
| 4,794,283 | 12/1988 | Allen et al. ............. | 307/360 |

FOREIGN PATENT DOCUMENTS 55-11626  1/1980  Japan .
55-68729  5/1980  Japan .

*Primary Examiner*—Eugene R. LaRoche
*Assistant Examiner*—Evelyn A. Lester

[57] ABSTRACT

A threshold comparator counts the instances when an alternating periodic signal crosses a level. To prevent false counts due to fluctuations in supply and ground potentials, a dual threshold comparator is constituted by a first inverter and a second inverter receiving the signal to be detected through a capacitor. The connected inputs of these inverters are biased by a source of bias voltage (Vbias) provided by a third inverter, the output of which is looped to the input. The geometries of the transistors of these three inverters are chosen as follows: the ratio between the geometries of the two transistors of the first inverter is slightly different from the corresponding ratio for the second inverter, and the ratio for the third inverter is in between the first two ratios. This makes it possible to have two change-over thresholds which are close to each other and make the comparator immune to noise.

21 Claims, 3 Drawing Sheets

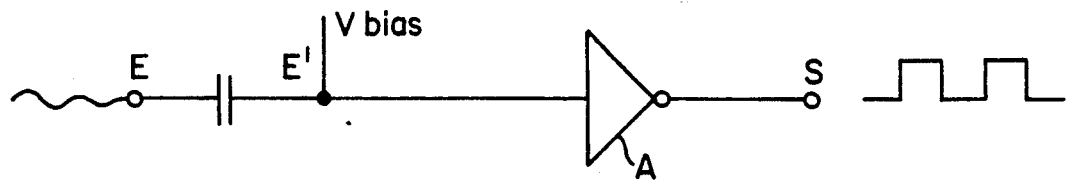
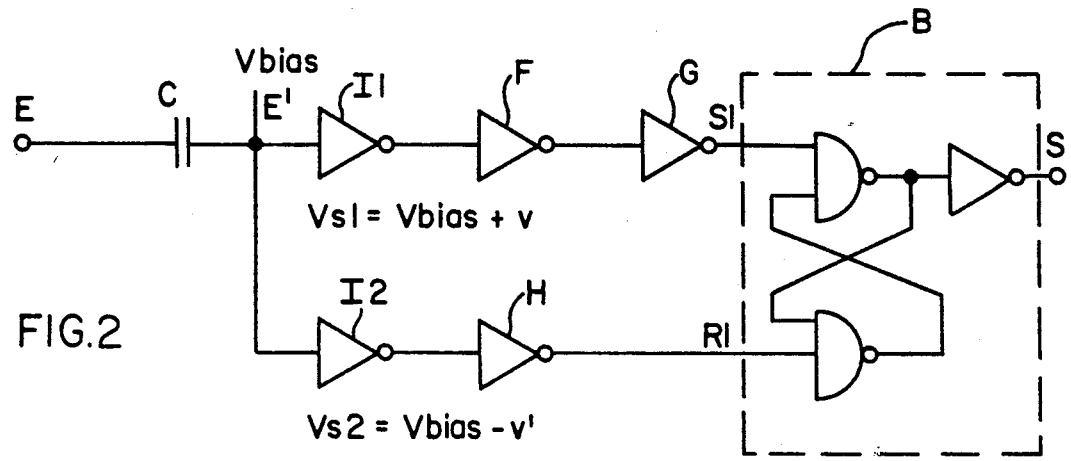
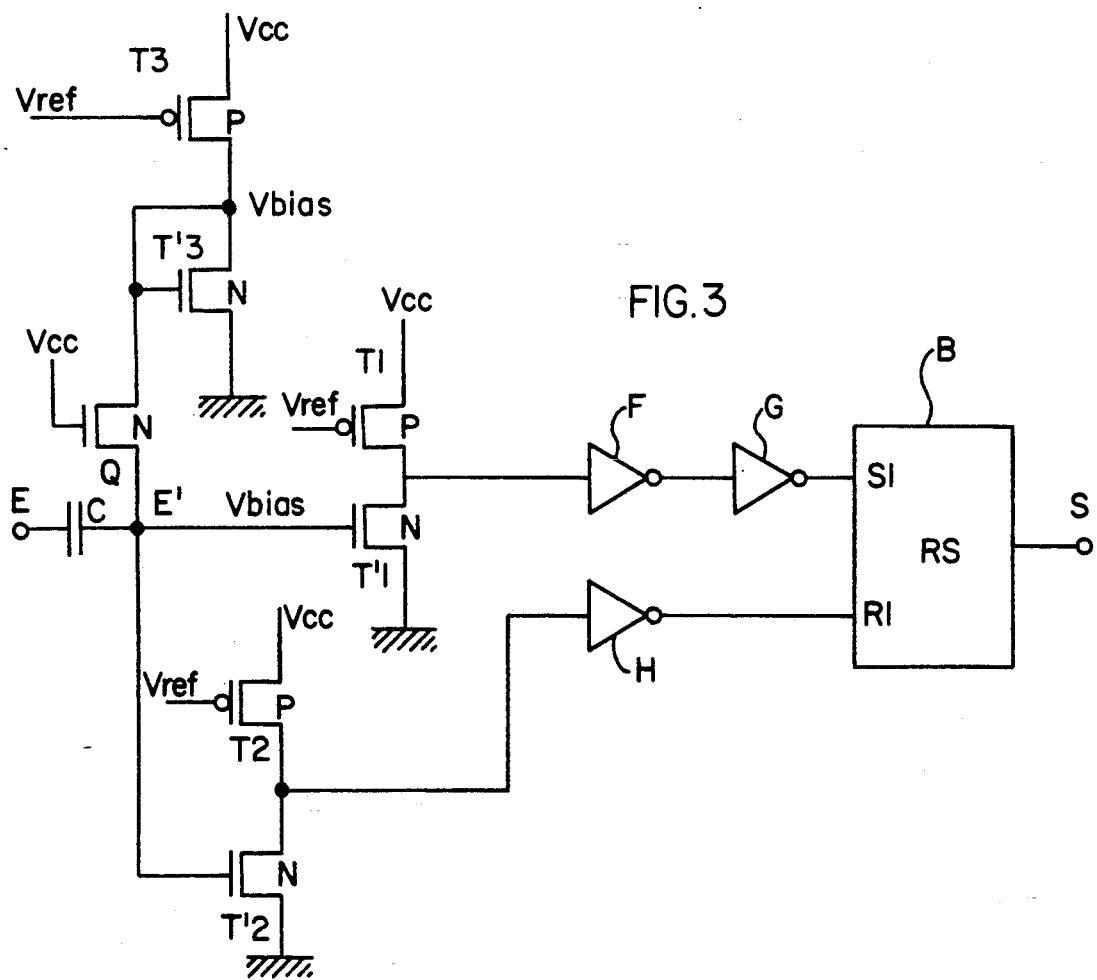

THRESHOLD COMPARATOR IMMUNIZED AGAINST NOISE

BACKGROUND OF THE INVENTION

1. Field of the Invention

The invention concerns integrated circuits and, more particularly, a way of making a threshold comparator that is immunized against noise, especially the noise constituted by the variations in the supply voltage Vcc of the integrated circuit or the variations in electrical ground potential.

2. Description of the Prior Art

In a threshold comparator, the threshold beyond which the comparator changes over to one direction or the other depends, to a greater or to a lesser degree, on the supply voltage of the comparator or, more exactly, on the difference between this voltage and the ground. But there may be fluctuations in the supply voltage or in the ground potential (this ground potential being variably distributed through the integrated circuit). These fluctuations, known as supply circuit noise, are a hindrance to the working of the comparator.

This is especially the case, for example, in a circuit for counting half waves of an alternating signal or in a circuit counting the instances when a periodic signal crosses a determined threshold. The comparator is used in this case to detect the instances when a determined threshold is crossed. However, if the reference voltage varies during the comparison, there is the risk of a double count when only one crossing of the threshold ought to be detected. The count is then false, and this is a very major drawback.

SUMMARY OF THE INVENTION

The present invention is a comparison circuit that does not have the drawbacks of prior art comparison circuits.

According to the invention, a threshold comparator protected from noise has a signal input designed to receive a signal with a variable level, at least one input capacitor connected to the signal input, two threshold inverters each having an input connected to the capacitor, these inverters having change-over thresholds close to each other, one of these thresholds corresponding to an input voltage value Vbias+v and the other to an input voltage value Vbias−v', v and v' being smaller than the supply voltage Vcc of the comparator, one of the outputs of the inverters being connected to a change-over input of an RS type flip-flop circuit and the other output to the restoration input of this flip-flop circuit, so as to prompt the change-over of the flip-flop circuit at a change in state of one of the inverters due to an instance when the input signal has gone beyond Vbias+v and so as to prompt restoration, at the change in state of the other inverter, due to the return of the input signal to below Vbias−v'.

Preferably, the voltage Vbias is a bias voltage defined by the output of a third inverter having its input looped to its output, this output being connected to the inputs of the first two inverters, each of the three inverters having two transistors in series and the geometries of the transistors of the inverters being chosen in such a way that the ratio between the geometry of the first transistor and the geometry of the second transistor for the first inverter is slightly different from the corresponding ratio for the second inverter, the corresponding ratio for the third inverter being in between the first two ratios.

The standard term, "geometry" of a transistor, is used herein to mean the ratio W/L between its channel width W and its channel length L.

In an advantageous practical embodiment of the invention, each of the three inverters has an N channel transistor in series with a P channel transistor. The input of the inverter may be constituted, for example, by the gate of the N channel transistor. The gate of the P channel transistor may be controlled by a reference voltage Vref common to all the inverters, or it may be connected to the input of the inverter.

The simplest circuit implementing the invention may include, for each inverter, a P channel transistor in series with an N channel transistor. The gates of all the P channel transistors (or, on the contrary, the N channel transistors) are controlled by the same reference voltage Vref. The P channel transistors all have the same channel width/length ratio. The N channel transistors of the first two inverters have channel width/length ratios that are slightly different from each other, and the corresponding channel width/length ratio for the third inverter is in between the ratios for the first two inverters.

Finally, an alternative embodiment consists in providing not for one third inverter to set up a bias voltage Vbias but two "third inverters" (which shall hereinafter be called third and fourth inverters) to set up two bias voltages Vbias−v' and Vbias+v' applied respectively to the input of the first inverter and of the second inverter. In this case, there are two capacitors, one connected between the signal input and the input of the first inverter, and the other connected between the signal input and the input of the second inverter. The first inverter preferably has transistors identical to those of the third inverter, and the second has transistors identical to those of the fourth inverter but slightly different from those of the first and third inverters, the third and fourth inverters having bias voltages that are slightly different from each other.

BRIEF DESCRIPTION OF THE DRAWINGS

Other characteristics and advantages of the invention shall appear from the following detailed description, made with reference to the appended drawings, of which:

FIG. 1 shows a standard diagram of a comparator used as an indicator that a level has been crossed, for example in order to count instances of crossings;

FIG. 2 shows a theoretical diagram of a comparator according to the invention;

FIG. 3 shows a preferred embodiment of a threshold comparator circuit according to the invention;

DESCRIPTION OF PREFERRED EMBODIMENTS

Figure 4:
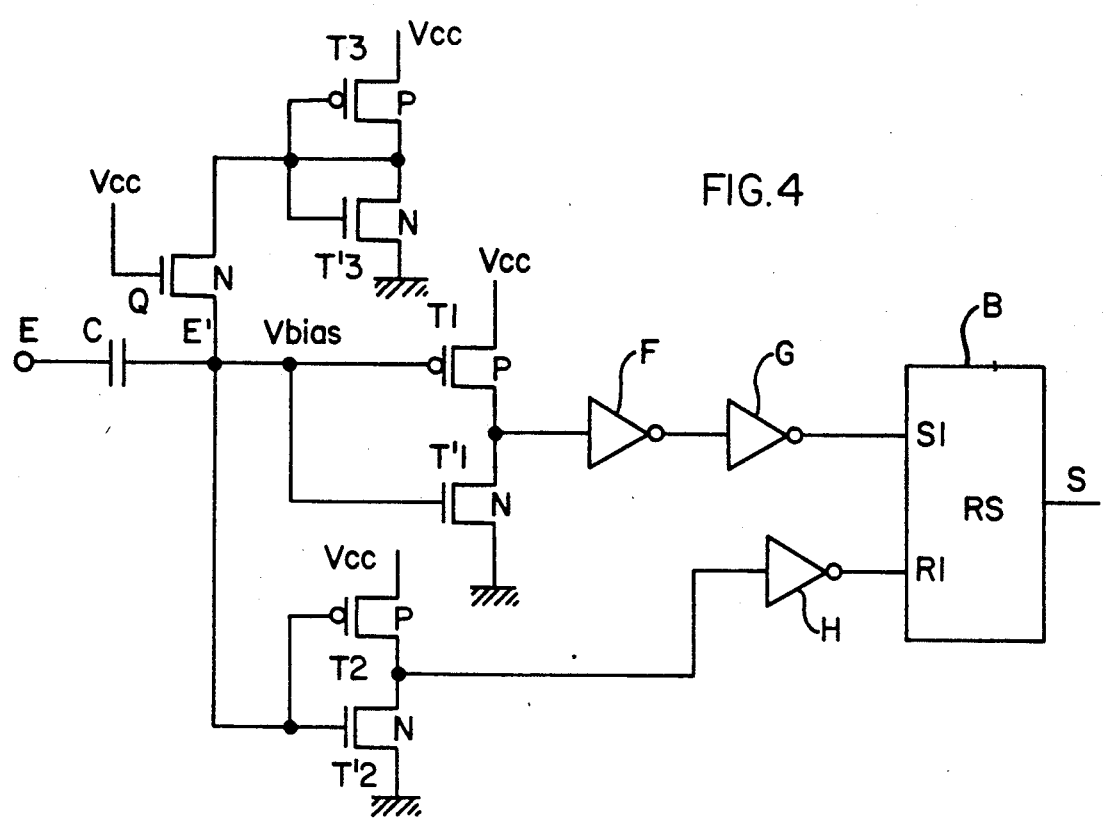
FIG. 4 shows an alternative embodiment.

The standard diagram of FIG. 1 has a signal input E, designed to receive a variable signal, such as an alternating periodic signal. It is desired to count, for example, the number of times that this signal goes beyond a reference level Vbias. A threshold comparator A is used. The signal input E is connected to a capacitor C which is, moreover, connected to the input of the threshold comparator A. The input of the comparator is biased at a fixed DC voltage Vbias which defines the threshold of comparison. The output S of the comparator gives a logic level 1 whenever the input signal goes over the threshold Vbias.

As explained here above, if the supply potentials (Vcc and ground) of the integrated circuit change, there is a risk that the reference potential Vbias will change too, and this may happen while the input signal is very close to the level Vbias. There is a risk of multiple counts for only one real instance in which the input signal goes beyond the level Vbias.

FIG. 2 shows a theoretical diagram explaining the way to overcome this drawback.

In FIG. 2, the input E is connected by a decoupling capacitor C to a common input E' of two threshold inverters I1 and I2. The input E' is biased by a voltage Vbias, but the thresholds of the inverters I1 and I2 are slightly different from Vbias: the threshold Vs1 of the inverter I1 is Vbias+v, the threshold of the inverter I2 is Vbias−v'. The voltages v and v' are low voltages as compared with the supply voltage Vcc. They could be equal (v=v'), but not necessarily so.

The output of the inverter I1 is connected, directly, or by means of cascade-mounted inverters (F', G in FIG. 2) to the change-over input S1 of an RS type flip-flop circuit B. The output of the inverter I2 is connected to the restoration input R1 of the flip-flop circuit by means of one or more cascade-mounted inverters (H). The number of inverters between I2 and the input R1 has a parity which is the inverse of that of the number of cascade-mounted inverters between I1 and the input S1.

It is only when the input signal level goes beyond Vbias+v that the flip-flop circuit B changes over under the effect of a change in state of its input S1. The state of the flip-flop circuit B is subsequently restored only when the level of the restoration input R1 changes under the effect of the fact that the input voltage has gone below the level Vbias−v'.

Even if the supply voltages fluctuate because of the presence of noise in the supply or the ground, there is then very little risk of false detections of instances where the threshold has been crossed.

FIG. 3 shows a preferred embodiment of the invention, enabling this protection against noise to be implemented in an extremely simple way.

In the embodiment of FIG. 3, in accordance with the block diagram of FIG. 2, the capacitor C is connected between the signal input E and the common input E' of two inverters I1 and I2, each formed by a set of two transistors in series. The bias voltage Vbias is given by a third inverter, the input of which is looped to its output, the output giving the voltage Vbias.

More precisely, the inverter I1 has a P channel MOS transistor T1 in series with an N channel MOS transistor T'1. The P channel transistor is connected by its source to Vcc, the N channel transistor is connected by its source to the ground. The gate of the P channel transistor T1 is controlled by a reference voltage Vref. The gate of the transistor T'1 constitutes the input of the inverter and is connected to the terminal E'. The output of the inverter is tapped at the mutually connected drains of the transistors T1 and T'1. It is this output that is connected, whether or not by means of other inverters (F, G), to an input S1 of the RS flip-flop circuit.

The inverter I2 is constituted exactly like the inverter I1, with transistors T2 and T'2. However, as shall be seen, the inverter I2 differs from the inverter I1 by the dimensions of its transistors. The output of the inverter I2, taken at the mutually connected drains of T2 and T'2, is connected to the other input R1 of the flip-flop circuit B.

The third inverter mentioned earlier, which sets up the bias voltage Vbias at the input E', includes a transistor T3 (P channel) in series with a transistor T'3 (N channel) between the supply Vcc and the ground. The gate of the transistor T3 is activated by the same reference voltage Vref as the gates of the transistors T1 and T2 of the inverters I1 and I2. The gate of the transistor T'3 is connected to the mutually connected drains of T3 and T'3. It constitutes both the input and the output of the inverter: this is the output at which the bias voltage Vbias is automatically set up. This output is connected through a transistor Q (playing the role of a resistor) to the input E' of the inverters I1 and I2. Q is, for example, an N channel transistor with its gate connected to Vcc and with a small channel width/length ratio (it is a so-called "long" transistor).

In this assembly, the bias voltage Vbias is determined automatically by the voltage Vref and by the dimensions of the transistors T3 and T'3: the value Vref (or, more precisely, Vcc-Vref) dictates the value of the current in the transistor T3, this current being proportional to the geometry of the transistor T3 for a given technology, i.e. for a given carrier mobility, a given gate oxide thickness and a given threshold voltage of the transistors. This current, in flowing in the transistor T'3, sets up a gate-source voltage Vbias that is proportional to this current and inversely proportional to the geometry of the transistor T'3. It will therefore be understood that Vbias is proportional to the ratio between the geometries of the P channel and N channel transistors of the inverter.

In the inverters I1 and I2, the reference voltage Vref applied to the P channel transistor and the bias voltage Vbias applied to the N channel transistor would tend to dictate a similar equilibrium in which the same current flows in the P channel transistor and the N channel transistor, that is if the ratios between the geometries of the P channel transistor and of the N channel transistor in these inverters are exactly the same as for the inverter T3, T'3.

If these geometries are modified, it is no longer possible to achieve equilibrium and inverters are set up having change-over threshold voltages that are different from the voltage Vbias.

More precisely, if the geometries of the transistors T3 and T'3 have a ratio K3=(W3/L3)/W'3/L'3), the geometries of T1 and T'1 will be chosen so as to have a ratio K1=(W1/L1)/(W'1/L'1) slightly greater than K3, and the geometries of T2 and T'2 have a ratio K2=(W2/L2)/(W'2/L'2) slightly lower than K3.

These choices may be applied by playing on the channel widths (W) or lengths (L) of the N channel transistors or P channel transistors. The simplest method is, for example, to choose inverters that are all identical except for the channel widths of the N channel transistors.

In one exemplary practical embodiment, it was found that channel widths of the N channel transistors with a ratio 27/20 between T1 and T3 and 17/20 between T2 and T3 were quite suitable.

In one alternative embodiment shown in FIG. 4, the inverters are again formed by a P channel transistor in series with an N channel transistor between Vcc and the ground but the P channel transistor, instead of having its gate connected to a reference voltage source Vref common to all three inverters, has its gate connected to the gate of the N channel transistor, i.e. to the input of the inverter. The working is the same, and the value of the change-over thresholds depends, here too, on the ratios of the geometries of the N channel and P channel transistors for the different inverters: the ratio for the third inverter (T3, T'3) is between the corresponding ratios for the first two inverters (T1, T'1 and T2, T'2).

Figure 5:
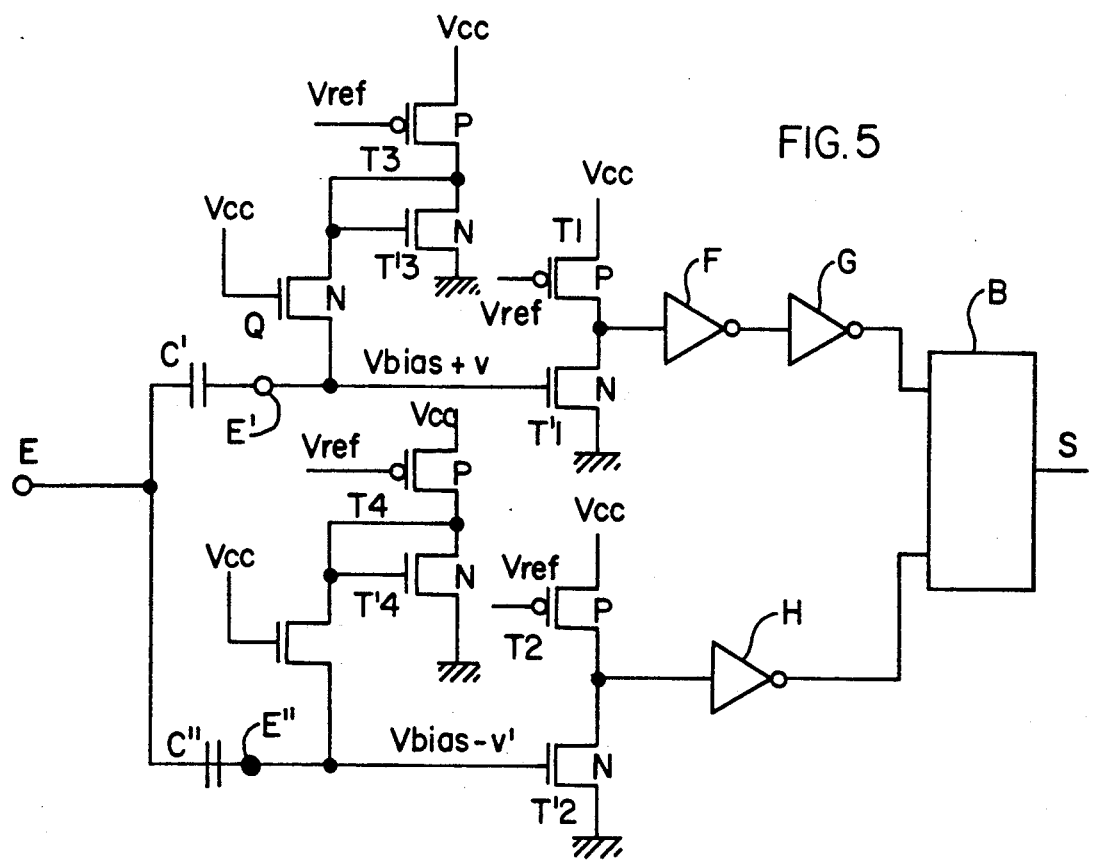
FIG. 5 shows another alternative embodiment.

Another exemplary embodiment shown in FIG. 5 uses a third inverter to define a bias voltage Vbias+v and a fourth inverter to define a bias voltage Vbias−v'. One of these bias voltages is applied to the input E' of the first inverter while the other is applied to the input E" of the second inverter. In effect, the inputs E' and E" of the first and second inverters are disconnected and each of these inputs E' and E" is connected by a respective capacitor C', C" to the signal input E.

The four inverters are constituted in the same way as in the already described embodiment of FIG. 3, the fourth inverter having a P channel transistor T4 in series with an N channel transistor T'4, each P channel transistor having its gate connected to a reference voltage source common to all the inverters.

Figure 6:
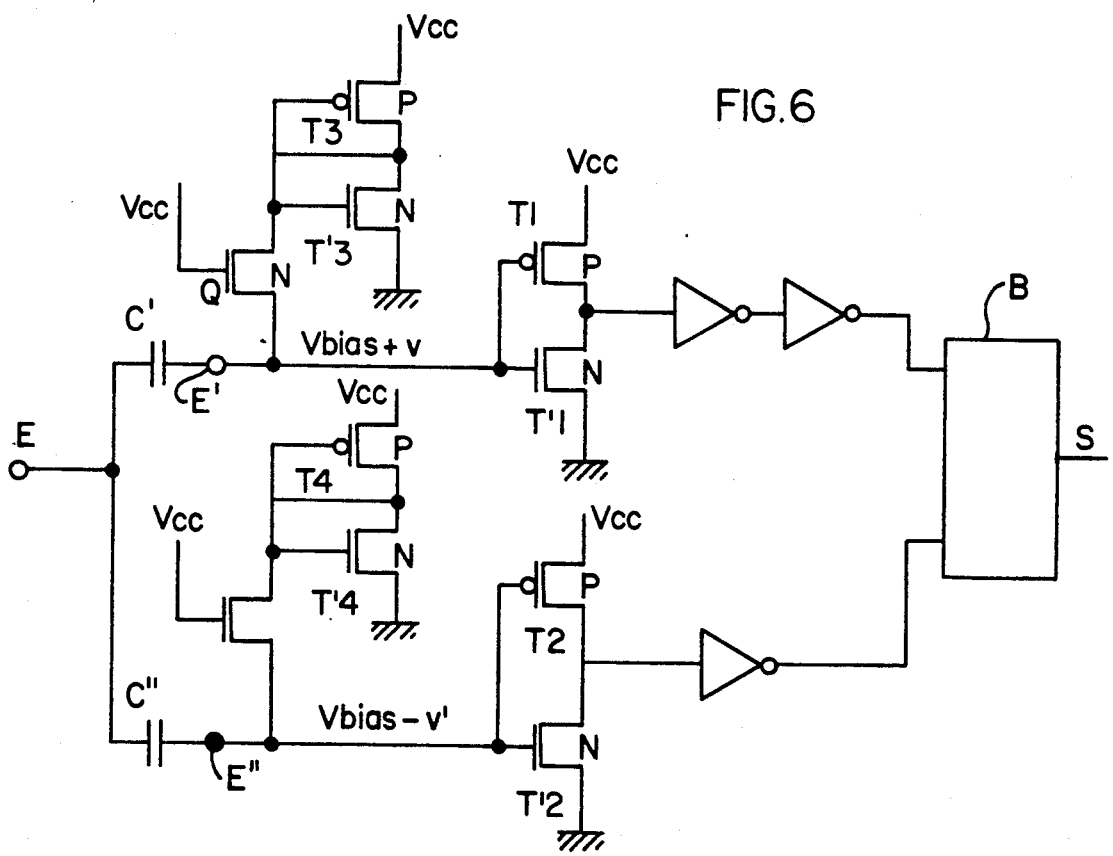
FIG. 6 shows another alternative embodiment.

FIG. 6 shows an alternative embodiment of FIG. 5 with the four inverters constituted as in the already described embodiment of FIG. 4, with the gate of each P channel transistor connected to the gate of the associated N channel transistor.

The first inverter preferably has geometries identical to those of the third one, and the second inverter has transistor geometries identical to those of the fourth one but slightly different from those of the first and third inverters: this difference sets up the difference between the bias voltages, hence between the change-over thresholds of the inverters.

What is claimed is:

1. A threshold comparator protected from noise, said comparator comprising:
   a terminal for a supply voltage Vcc;
   a flip-flop circuit, said flip-flop circuit having a change-over input and a restoration input;
   a signal input designed to receive an input signal with a variable level;
   at least one input capacitor connected to said signal input;
   first and second inverters, each of said first and second inverters having an output, each of said first and second inverters having an input connected to an input capacitor which is connected to said signal input, each of said inverters being coupled to said supply voltage terminal, said first and second inverters being chosen in such a way that said first and second inverters have change-over thresholds close to but slightly different from each other, one of these thresholds corresponding to an input voltage value Vbias+v and the other of these thresholds corresponding to an input voltage value Vbias−v', v and v' being smaller than said supply voltage Vcc, one of the outputs of said first and second inverters being connected to said change-over input of said flip-flop circuit and the other output of said first and second inverters being connected to said restoration input of said flip-flop circuit, so as to prompt the changing over of said flip-flop circuit at a change in state of one of said first and second inverters due to an instance when said input signal has gone above Vbias+v and so as to prompt restoration, at the change in state of the other of said first and second inverters, due to the return of said input signal to below Vbias−v'.

2. A threshold comparator according to claim 1 further comprising a bias circuit for applying the voltage Vbias to the inputs of said first and second inverters, said bias circuit coupled to said supply voltage terminal.

3. A threshold comparator according to claim 1 wherein each of said first and second inverters has a P channel transistor in series with an N channel transistor, with the geometries (W/L) of the P channel transistors and of the N channel transistors being chosen in such a way that the ratio between the geometries of the P channel transistor and the N channel transistor of said first inverter is slightly different from the ratio between the geometries of the P channel transistor and the N channel transistor of said second inverter.

4. A threshold comparator according to claim 1, wherein said flip-flop circuit is an RS type flip-flop circuit.

5. A threshold comparator according to claim 1, wherein said one of the outputs of said first and second inverters is connected through at least one inverter to said change-over input of said flip-flop circuit, wherein said other output of said first and second inverters is connected through at least one inverter to said restoration input of said flip-flop circuit, the number of inverters between said one of the outputs and change-over input having a parity which is the inverse of that of the number of inverters between said other output and said restoration input.

6. A threshold comparator according to claim 1, wherein each of said first and second inverters has a P channel transistor in series with an N channel transistor, wherein the input of each of said first and second inverters is constituted by the mutually connected gates of the P channel transistor and the N channel transistor of the respective inverter, and the output of each of said first and second inverters is constituted by the mutually connected drains of the P channel transistor and the N channel transistor of the respective inverter.

7. A threshold comparator according to claim 1, wherein each of said first and second inverters has a P channel transistor in series with an N channel transistor; wherein each P channel transistor has its source connected to said terminal of a supply voltage Vcc and its gate controlled by a reference voltage Vref; wherein each N channel transistor has its source connected to the ground and its drain connected to the drain of the associated P channel transistor; wherein the gate of each N channel transistor constitutes the input of the respective inverter; the reference voltage Vref being the same for each of said first and second inverters; and wherein the output of the respective inverter is at the mutually connected drains of the P channel transistor and the N channel transistor that form the respective inverter.

8. A threshold comparator according to claim 1, wherein the voltage Vbias is defined by the output of a third inverter having its input looped to its output, this output being connected to the inputs of the first and second inverters, said third inverter coupled to said supply voltage terminal.

9. A threshold comparator according to claim 8 wherein each of said first, second and third inverters has a P channel transistor in series with an N channel transistor, with the geometries (W/L) of the P channel transistors and of the N channel transistors being chosen in such a way that the ratio between the geometries of the P channel transistor and the N channel transistor of first inverter is slightly different from the ratio between the geometries of the P channel transistor and the N channel transistor of said second inverter, the ratio between the geometries of the P channel transistor and the N channel transistor of said third inverter being in between the first two mentioned ratios.

10. A threshold comparator according to claim 9, wherein the input of each of said first, second and third inverters is constituted by the mutually connected gates of the P channel transistor and the N channel transistor of the respective inverter, and the output of each of said first, second and third inverters is constituted by the mutually connected drains of the P channel transistor and the N channel transistor of the respective inverter.

11. A threshold comparator protected from noise, said comparator comprising:
a terminal for a supply voltage Vcc;
a flip-flip circuit, said flip-flop circuit having a change-over input and a restoration input;
a signal input designed to receive an input signal with a variable level;
at least one input capacitor connected to said signal input;
first and second inverters, each of said first and second inverters having an output, each of said first and second inverters having an input connected to an input capacitor which is connected to said signal input, said first and second inverters being chosen in such a way that said first and second inverters have change-over thresholds close to but slightly different from each other, one of these thresholds corresponding to an input voltage value Vbias+v and the other of these thresholds corresponding to an input voltage value Bbias−v', v and v' being smaller than said supply voltage Vcc, one of the outputs of said first and second inverters being connected to said change-over input of said flip-flop circuit and the other output of said first and second inverters being connected to said restoration input of said flip-flop circuit, so as to prompt the changing over of said flip-flop circuit at a change in state of one of said first and second inverters due to an instance when said input signal has gone above Vbias+v and so as to prompt restoration, at the change in state of the other of said first and second inverters, due to the return of said input signal to below Vbias−v';
wherein the voltage Vbias is defined by the output of a third inverter having its input looped to its output, this output of said third inverter being connected to the inputs of said first and second inverters;
wherein each of said first, second and third inverters has a P channel transistor in series with an N channel transistor; each P channel transistor having its source connected to said terminal of a supply voltage Vcc and its gate controlled by a reference voltage Vref; each said N channel transistor having its source connected to the ground, its gate constituting the input of the respective inverter and its drain being connected to the drain of the associated P channel transistor; the reference voltage Vref being the same for each of said first, second and third inverters; and the output of the respective inverter being taken at the mutually connected drains of the P channel transistor and the N channel transistor that form the respective inverter; and the geometries (W/L) of the P channel transistors and of the N channel transistor being chosen in such a way that the ratio between the geometries of the P channel transistor and the N channel transistor of said first inverter is slightly different form the ratio between the geometries of the P channel transistor and the N channel transistor of said second inverter, the ratio between the geometries of the P channel inverter being in between the first two mentioned ratios.

12. The threshold comparator according to claim 11 wherein the inputs of said first and second inverters are connected through a single input capacitor to said signal input.

13. A threshold comparator according to claim 12 wherein said flip-flop circuit is an Rs type flip-flop circuit.

14. A threshold comparator according to claim 13 wherein the outputs of said third inverter is connected through a bias circuit transistor to the inputs of said first and second inverters, the gate of said bias circuit transistor being connected to said terminal for a supply voltage Vcc.

15. A threshold comparator protected from noise, said comparator comprising:
a terminal for a supply voltage Vcc,
a flip-flop circuit, said flip-flop circuit having a change-over input and a restoration input;
a signal input designed to receive an input signal with a variable level;
first and second inverters, each of said first and second inverters and an input, each of said inverters coupled to said supply voltage terminal, having an output,
a first capacitor connected between the signal input and the input of said first inverter, a second capacitor connected between the signal input and the input of said second inverter,
a third inverter having its input looped to its output and being used to set up a first bias voltage Vbias+v at the input of said first inverter, said third inverter coupled to said supply voltage terminal, and
a fourth inverter having its input looped to its output to set up a second bias voltage Vbias−v' at the input of said second inverter,
said first and second inverters said fourth inverter coupled to said supply voltage terminal, being chosen in such a way that said first and second inverters have change-over thresholds close to but slightly different from each other, one of these thresholds corresponding to an input voltage value Vbias+v and the other of these thresholds corresponding to an input voltage value Vbias−v', v and v' being smaller than said supply voltage Vcc, one of the outputs of said first and second inverters being connected to said change-over input of said flip-flop circuit and the other output of said first and second inverters being connected to said restoration input of said flip-flop circuit, so as to prompt the changing over of said flip-flop circuit at a change in state of one of said first and second inverters due to an instance when the input signal has gone above Vbias+v and so as to prompt restoration, at the change in state of the other of said first and second inverters, due to the return of the input signal to below vbias−v'.

16. A threshold comparator according to claim 15 wherein each of said first, second, third, and fourth inverters has a P channel transistor in series with an N channel transistor, with the geometries (W/L) of the P channel transistors and of the N channel transistors being chosen in such a way that the ratio between the geometries of the P channel transistor and the N channel transistor of said first inverter is slightly different from the ratio between the geometries of the P channel transistor and the N channel transistor of said second inverter.

17. A threshold comparator according to claim 16 wherein the geometries of the P channel transistor and the N channel transistor of said first inverter are identical to the geometries of the P channel transistor and the N channel transistor of said third inverter, and wherein the geometries of the P channel transistor and the N channel transistor of said second inverter are identical to the geometries of the P channel transistor and the N channel transistor of said fourth inverter.

18. A threshold comparator according to claim 17, wherein said flip-flop circuit is an RS type flip-flop circuit.

19. A threshold comparator according to claim 15 wherein each of said first, second, third, and fourth inverters has a P channel transistor in series with an N channel transistor; wherein each P channel transistor has its source connected to said terminal of a supply voltage Vcc and its gate controlled by a reference voltage Vref; wherein each N channel transistor has its source connected to the ground and its drain connected to the drain of the associated P channel transistor; wherein the gate of each N channel transistor constitutes the input of the respective inverter; the reference voltage Vref being the same for each of said first, second, third, and fourth inverters; and wherein the output of the respective inverter is at the mutually connected drains of the P channel transistor and the N channel transistor that form the respective inverter.

20. A threshold comparator according to claim 15 wherein each of said first, second, third, and fourth inverters has a P channel transistor in series with an N channel transistor, with the geometries (W/L) of the P channel transistors and of the N channel transistors being chosen in such a way that the ratio between the geometries of the P channel transistor and the N channel transistor of said first inverter is slightly different from the ratio between the geometries of the P channel transistor and the N channel transistor of said second inverter, the ratio between the geometries of the P channel transistor and the N channel transistor of said third inverter and the ratio between the geometries of the P channel transistor and the N channel transistor of said fourth inverter being in between the first two mentioned ratios.

21. A threshold comparator according to claim 15 wherein each of said first, second, third, and fourth inverters has a P channel transistor in series with an N channel transistor; wherein each P channel transistor has its source connected to said terminal of a supply voltage Vcc; wherein each N channel transistor has its source connected to the ground and its drain connected to the drain of the associated P channel transistor; wherein the input of each of said first, second, third and fourth inverters is constituted by the mutually connected gates of the P channel transistor and the N channel transistor of the respective inverter; and wherein the output of each of said first, second, third and fourth inverters is at the mutually connected drains of the P channel transistor and the N channel transistor that form the respective inverter.

* * * * *